United States Patent
Roberts, Jr.

(10) Patent No.: US 10,422,828 B2
(45) Date of Patent: Sep. 24, 2019

(54) METHOD AND SYSTEM FOR UTILIZING STAND-ALONE CONTROLLER IN MULTIPLEXED HANDLER TEST CELL FOR INDEXLESS TANDEM SEMICONDUCTOR TEST

(75) Inventor: Howard H. Roberts, Jr., Austin, TX (US)

(73) Assignee: CELERINT, LLC., New York, NY (US)

( * ) Notice: Subject to any disclaimer, the term of this patent is extended or adjusted under 35 U.S.C. 154(b) by 1611 days.

(21) Appl. No.: 14/001,727

(22) PCT Filed: Feb. 29, 2012

(86) PCT No.: PCT/US2012/027079
§ 371 (c)(1),
(2), (4) Date: Aug. 27, 2013

(87) PCT Pub. No.: WO2012/118880
PCT Pub. Date: Sep. 7, 2012

(65) Prior Publication Data
US 2014/0046613 A1    Feb. 13, 2014

Related U.S. Application Data

(60) Provisional application No. 61/447,787, filed on Mar. 1, 2011.

(51) Int. Cl.
*G01R 31/26* (2014.01)
*G01R 31/28* (2006.01)

(52) U.S. Cl.
CPC ..... *G01R 31/2601* (2013.01); *G01R 31/2893* (2013.01)

(58) Field of Classification Search
None
See application file for complete search history.

(56) References Cited

U.S. PATENT DOCUMENTS 3,353,669 A    11/1967    Broderick et al.
5,650,732 A    7/1997    Sakai
(Continued)

FOREIGN PATENT DOCUMENTS

CN    1185032    6/1998
WO    2012/118880 A3    9/2012

OTHER PUBLICATIONS

Malaysia Substantive Examination Adverse Report, dated Oct. 31, 2017 from MyIPO, in related Malaysian Patent Application No. PI 2013701534.
(Continued)

*Primary Examiner* — Reema Patel
*Assistant Examiner* — Steven M Christopher
(74) *Attorney, Agent, or Firm* — Greenblum & Bernstein, P.L.C.

(57) ABSTRACT

A system and method utilize a stand-alone controller for a multiplexed handler test cell in automated and robotic semiconductor test equipment for indexless tandem semiconductor testing. The stand-alone controller is configured such that functions relating to both the handler drivers and the data post-processor of the multiplexed handler tested cell are included within the stand-alone controller. The system and method also include provisions for using a virtual multiplexed handler test cell in a preliminary stage prior to actual implementation of the actual multiplexed handler test cell. This configuration permits the stand-alone controller to control the functions of the multiplexed handlers and to coordinate their activity with the tester.

9 Claims, 9 Drawing Sheets

(56) References Cited

U.S. PATENT DOCUMENTS

| | | |
|---|---|---|
| 5,926,774 A | 7/1999 | Ohishi |
| 5,968,193 A | 10/1999 | Ang |
| 6,075,358 A | 6/2000 | Hetzel et al. |
| 6,225,798 B1 | 5/2001 | Onishi et al. |
| 6,237,126 B1 | 5/2001 | Bonitz |
| 6,515,470 B2 | 2/2003 | Suzuki et al. |
| 6,831,454 B2 | 12/2004 | Bae et al. |
| 6,858,447 B2 | 2/2005 | Hartmann et al. |
| 6,937,006 B2 | 8/2005 | West |
| 6,958,617 B1 | 10/2005 | Rhodes et al. |
| 7,183,785 B2 | 2/2007 | Roberts et al. |
| 7,196,508 B2 | 3/2007 | Ham et al. |
| 7,230,417 B2 | 6/2007 | Chung et al. |
| 7,480,840 B2 | 1/2009 | Hathorn et al. |
| 7,508,191 B2 | 3/2009 | Roberts |
| 7,619,432 B2 | 11/2009 | Roberts |
| 2003/0059962 A1 | 3/2003 | Hartmann et al. |
| 2003/0141877 A1 | 7/2003 | Williams et al. |
| 2003/0197521 A1 | 10/2003 | Weimer |
| 2004/0143411 A1 | 7/2004 | Wu |
| 2006/0288349 A1 | 12/2006 | Zimmer et al. |
| 2007/0126448 A1 | 6/2007 | Hubscher et al. |
| 2007/0132477 A1* | 6/2007 | Balog ............... G01R 31/2894 324/762.01 |
| 2008/0007285 A1 | 1/2008 | Nakase et al. |
| 2008/0061766 A1 | 3/2008 | LaBerge |
| 2008/0076298 A1 | 3/2008 | Matsumura et al. |
| 2008/0278186 A1 | 11/2008 | Jung |

OTHER PUBLICATIONS

Office Action, dated Jun. 19, 2015, from the State Intellectual Property Office of China, for the corresponding Chinese Patent Application No. 201280011154.X.

Examination Report, dated Jun. 16, 2015, from the Intellectual Property Office of Singapore (IPOS) for the corresponding Singapore Patent Application No. 2013063078.

International Preliminary Report on Patentability, dated Mar. 18, 2014, for the corresponding International Application No. PCT/US2012/027079.

International Search Report and Written Opinion, dated Jun. 20, 2012, in corresponding International Application No. PCT/US2012/027079.

Philippines Substantive Examination Report, dated Apr. 30, 2018, from the Intellectual Property Office of the Philippines, Bureau of Patents, for the corresponding Philippines Patent Application No. 1/2013/501777.

* cited by examiner

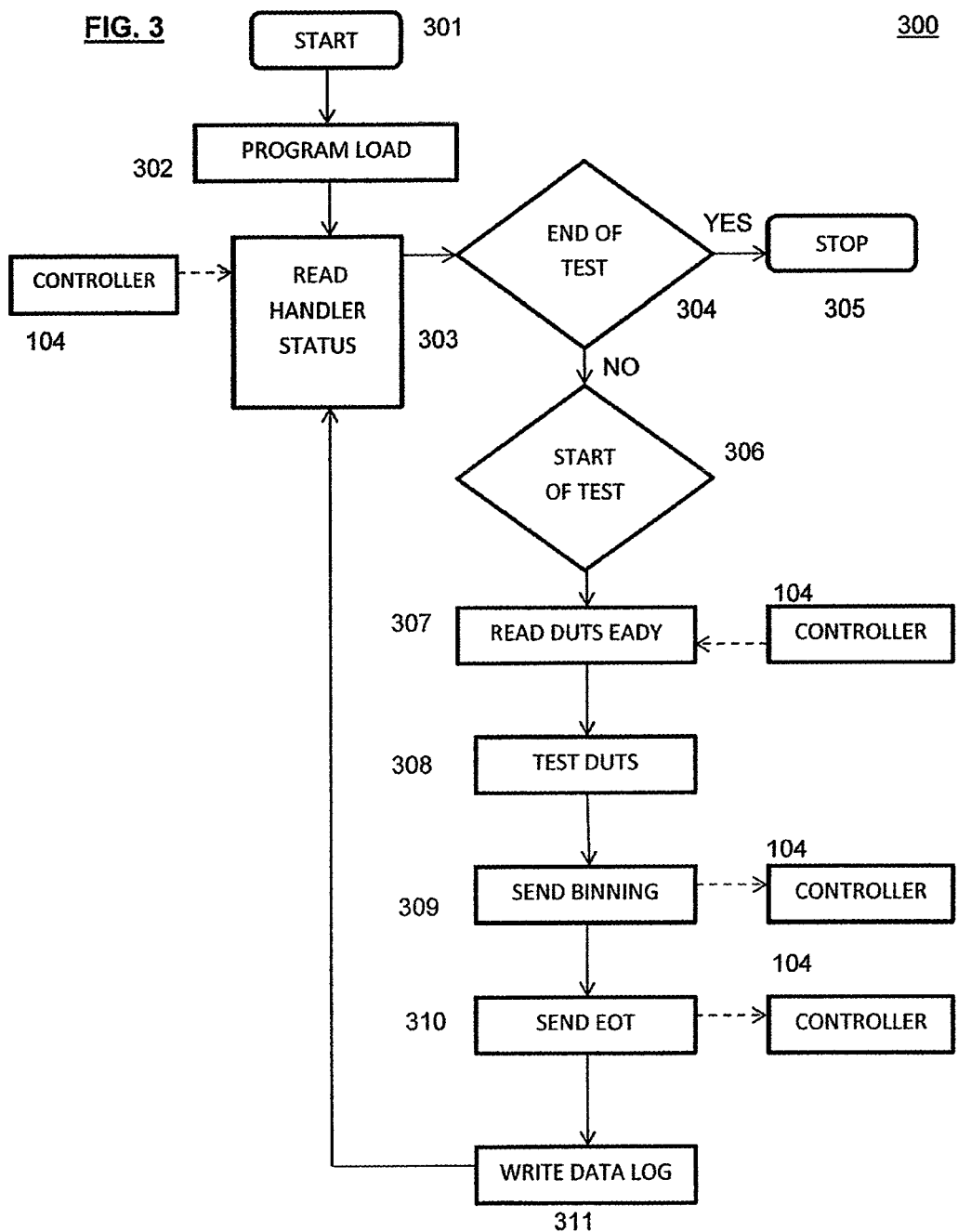

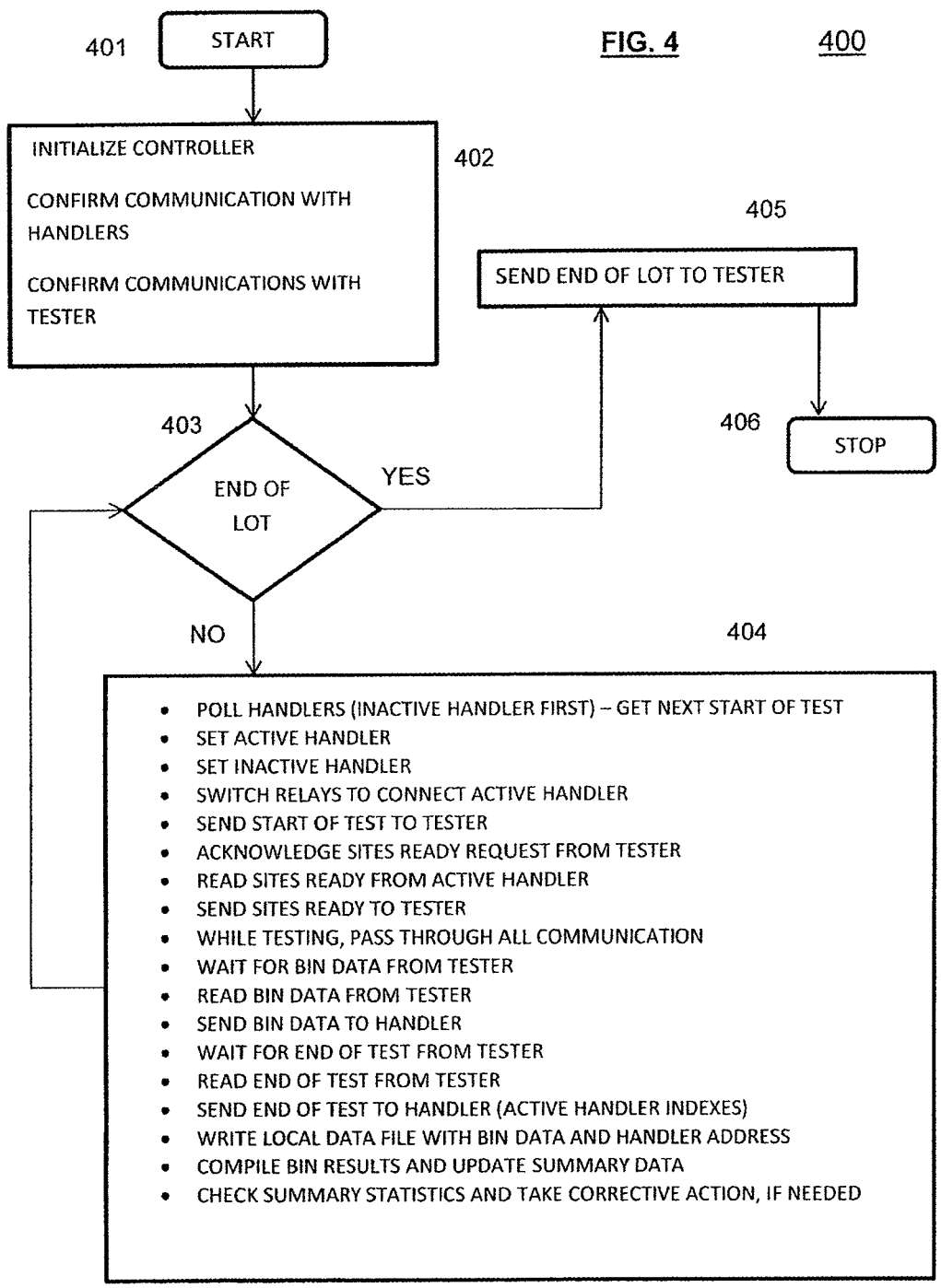

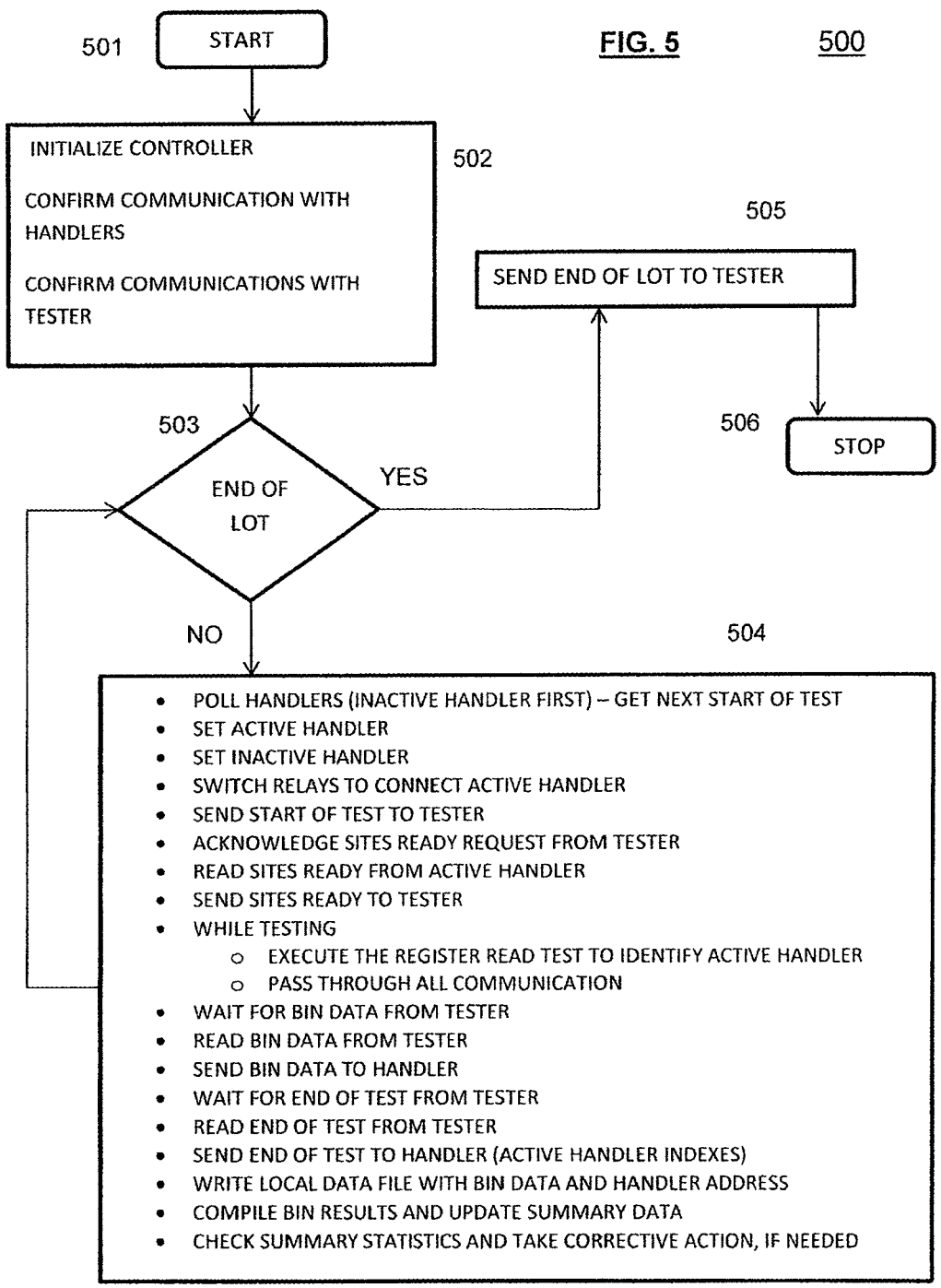

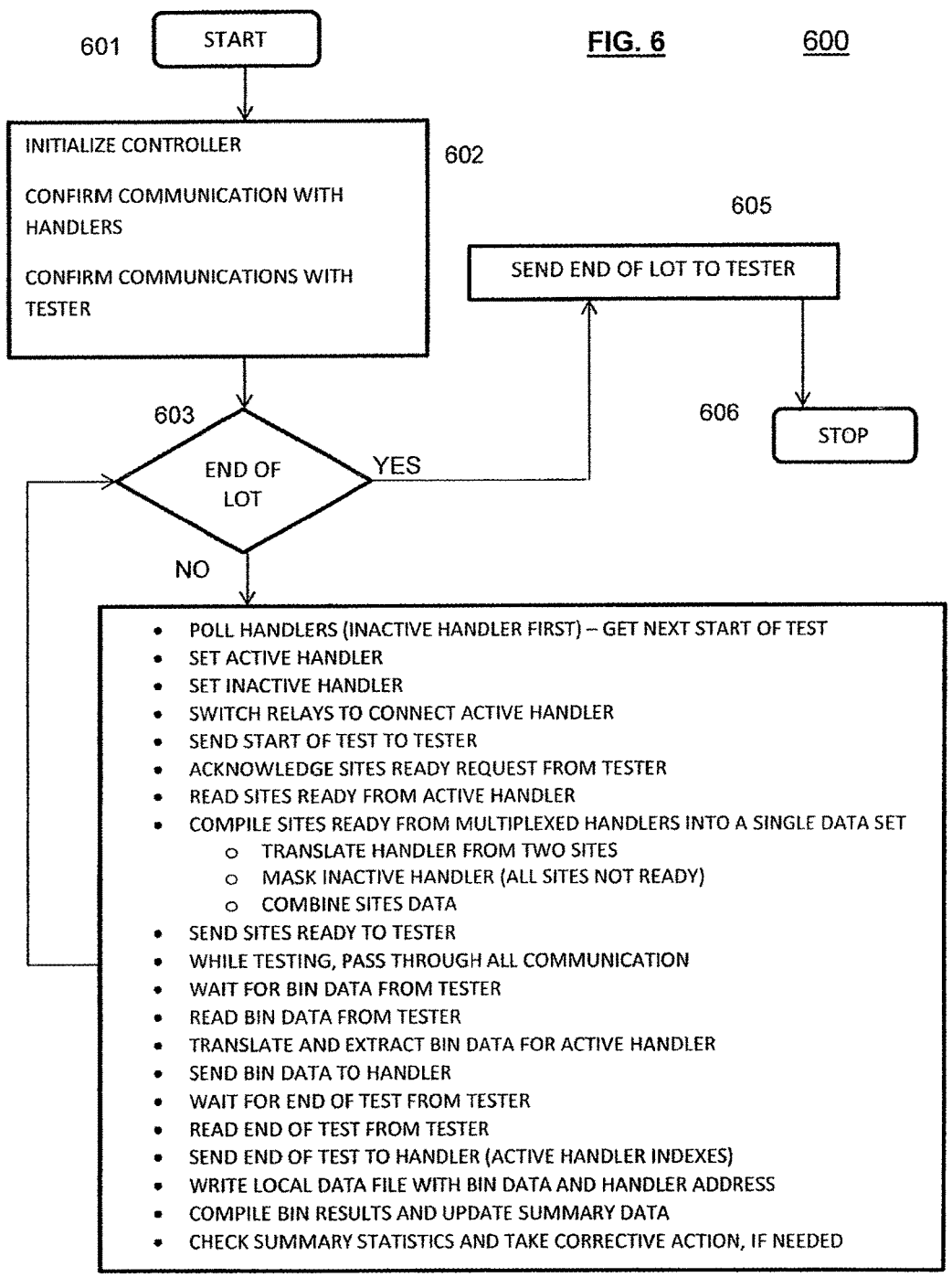

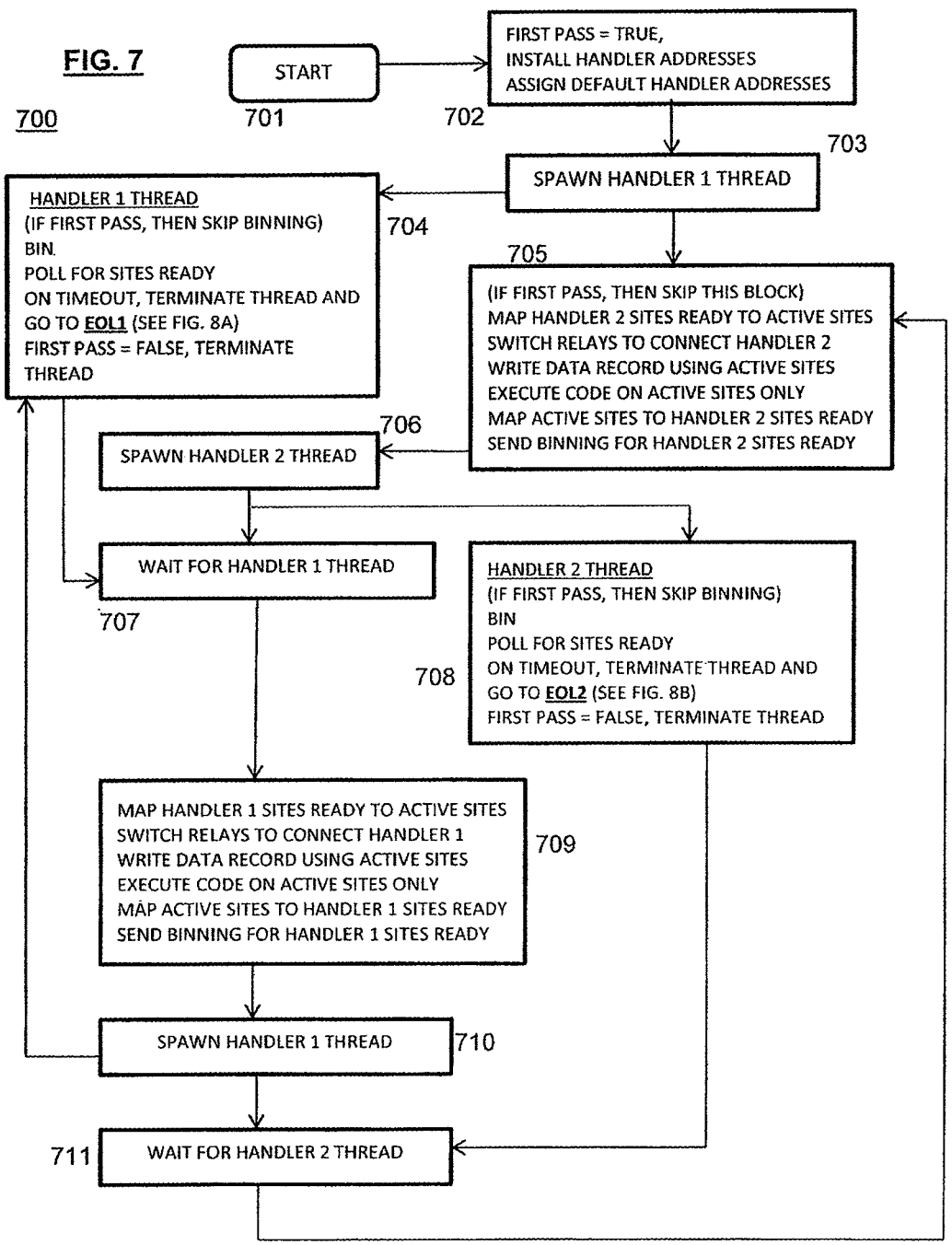

METHOD AND SYSTEM FOR UTILIZING STAND-ALONE CONTROLLER IN MULTIPLEXED HANDLER TEST CELL FOR INDEXLESS TANDEM SEMICONDUCTOR TEST

CROSS-REFERENCE TO RELATED APPLICATION

This application claims priority for U.S. Provisional Patent Application No. 61/447,787, entitled Multiplexed Handler Controller for Indexless Tandem Semiconductor Test, filed on Mar. 1, 2011, which is incorporated herein in its entirety.

TECHNICAL FIELD

The present disclosure relates to automated manufacture systems and methods, particularly automated and robotic semiconductor equipment systems and methods, for testing and manufacture quality control of semiconductors, wherein index timing delays are reduced.

BACKGROUND

Automated manufacturing equipment has streamlined the manufacturing process in many industries. Moreover, such automation has increased reliability and results. A downside of automation has been timing delays in equipment operations. Particularly, where expensive manufacturing equipment is involved, delays in operations of the equipment, such as during mechanical movements in transferring devices under test, limits returns on the costs of such equipment because of idle or non-testing use periods during mechanical manipulations, resets, and the like. An impetus in manufacturing technology and operation has, therefore, been to limit times in which costly test equipment is idle and not performing the applicable test function.

In semiconductor manufacture, semiconductor device test equipment is a costly capital requirement. Conventionally, such test equipment has included a robotic manipulator for handling the devices being tested. This robotic manipulator is commonly referred to as a "handler" and is typically configured with one or more robotic arms referred to as "manipulators." The manipulator mechanically picks up a device for testing, inserts the device into an interface test board and issues a start-of-test signal to the tester. The tester then conducts a test on the device and returns a test result and an end-of-test signal to the handler that causes the handler to disposition the device to a post-test tray or receptacle for holding tested devices. This process is repeated as long as the handler senses that there are additional devices available for test. This system as a whole is sometimes referred to as a "test cell."

During the time required for the handler to disposition a device(s) just tested and replace the device(s) with the next device(s) to be tested, the tester remains substantially idle. This idle time sometimes referred to as "index time" for the particular tester and system, involves mechanical manipulations of the devices awaiting test and having been tested. These mechanical manipulations are limited in speed of operations by various factors, including, for example, physical and speed constraints to ensure that devices to be tested are not damaged, contaminated, dropped, and the like.

The time required to test a device is sometimes referred to as "test time" for a particular device, test, tester, and system. When the system is operational in a manufacturing capacity, it is either indexing during the index time or otherwise testing during the test time.

Previously, test equipment manufacturers have focused efforts to reduce index time on design of manufacturing equipment to increase speed of mechanical operations. Although speeds of mechanical operations in handling the test devices have increased significantly over time, there nonetheless remains significant mechanical index time required to manipulate test devices between tests, by the robotic handlers. Moreover, with increased speeds of mechanical manipulation equipment operations, costs increase for the equipment, including calibration, replacement frequency, maintenance, parts, and others. Given the constraints and precautions that must be addressed in speeding mechanical manipulations of many types of test devices and handlers, further speeding of mechanical operations is subject to economic and physical barriers.

In any event, reducing index time can provide greater returns on investments in test equipment, particularly where the test equipment is costly. It would, therefore be a significant improvement in the art and the technology to further reduce index time involved in test operations in manufacturing environments. Particularly in semiconductor manufacture, economic and other gains and advantages are possible if index times are reduced in the testing of semiconductor equipment. It would also be an improvement to provide new and improved systems and methods for achieving reduced index times, without requiring substantial changes or new developments in existing mechanical operations of device handlers and similar robotic or automated components for the testing. Examples of recent advancements made by the present inventor in reducing index time for automated and robotic semiconductor testing are disclosed in other patents by the present inventor, including U.S. Pat. No. 7,183,785 B2, U.S. Pat. No. 7,508,191 B2, and U.S. Pat. No. 7,619,432 B2.

In addition to the advantages of reducing index times discussed above, it would also be an improvement to provide new and improved systems and methods for setting up and configuring the control systems for automated and robotic semiconductor test equipment, which further reduces the cost, complexity, index time, and downtime of testing operations associated with the automated and robotic semiconductor test equipment. For instance, multiplexed handler test cells in automated and robotic semiconductor test equipment have previously been designed such that both the handler driver(s) and the data post-processor reside on the test system's workstation computer. The handler driver(s) programs were designed as multi-threaded processes that run in the background of the computer processor, while the test programs execute in the foreground. Data post-processor programs are called and executed at the end of the testing lot. Since handler driver programs and data post-processor programs must be integrated into the manufacturer's overall test program and computer network, a time consuming and costly series of activities must be performed in order to insure that integration occurs seamlessly and without introducing errors, instability, and/or security risks into the system.

SUMMARY

A system and method for utilizing a stand-alone controller for a multiplexed handler test cell in automated and robotic semiconductor test equipment is described herein with reference to several exemplary embodiments. The stand-alone controller is configured such that functions relating to both the handler drivers and the data post-processor of the multiplexed handler tested cell are included within the stand-alone controller. This configuration permits the stand-alone controller to more efficiently control the functions of the multiplexed handlers and to coordinate their activity with the tester. Benefits derived from the system and method that utilize this configuration are many, including lower setup and operational costs, reduced system complexity, easier maintainability, and enhanced support features.

In view of the foregoing, various embodiments are envisioned. According to one embodiment of the present disclosure, a system is provided for utilizing a stand-alone controller in a multiplexed handler test cell. The system includes a plurality of multiplexed handlers that handle devices subjected to testing. The system also includes a tester that tests the devices subjected to testing that are associated with one of the plurality of multiplexed handlers at a time, in accordance with testing instructions received over a communication link. The system further includes a stand-alone controller that is operationally located between the tester and the plurality of handling devices, the stand-alone controller including a storage that stores a set of testing instructions, and a processor that executes the set of testing instructions and that sends the executed testing instructions to the tester over the communication link. Furthermore, the testing includes negligible index time.

Another embodiment of the system includes the stand-alone controller implementing one of a plurality of selectable operational modes during testing of the devices subjected to testing.

A further embodiment of the system includes a first selectable operational mode that monitors yield differences among the plurality of multiplexed handlers.

An embodiment of the system includes a second selectable operational mode that modifies the set of testing instructions by adding a test to read a status register on a multiplexing tester board.

Another embodiment of the system includes a third selectable operational mode that maps multiple test sites to same tester resources.

A further embodiment of the system includes a fourth selectable operational mode that utilizes multithreading in executing the set of testing instructions.

An embodiment of the system includes a graphical user interface, wherein the storage stores a set of post-testing instructions that are executed by the processor such that the stand-alone controller generates an analysis of results of the testing that are displayed on the graphical user interface.

Another embodiment of the system includes the generation of initial setup parameters of the stand-alone controller are generated by utilizing a virtual tester and a plurality of virtual multiplexed handlers.

A further embodiment of the system includes communication interfaces for the plurality of multiplexed handlers and the tester for communicating with the stand-alone controller.

Additional embodiments include methods and non-transitory computer readable mediums that include features similar to the features recited in the system embodiments described above.

BRIEF DESCRIPTION OF THE DRAWINGS

FIG. 3 illustrates a flowchart of the overall control flow of the testing process;

FIG. 4 illustrates operational mode 1 of the test cell;

FIG. 5 illustrates operational mode 2 of the test cell;

FIG. 6 illustrates operational mode 3 of the test cell;

FIG. 7.

DETAILED DESCRIPTION

Figure 1A:
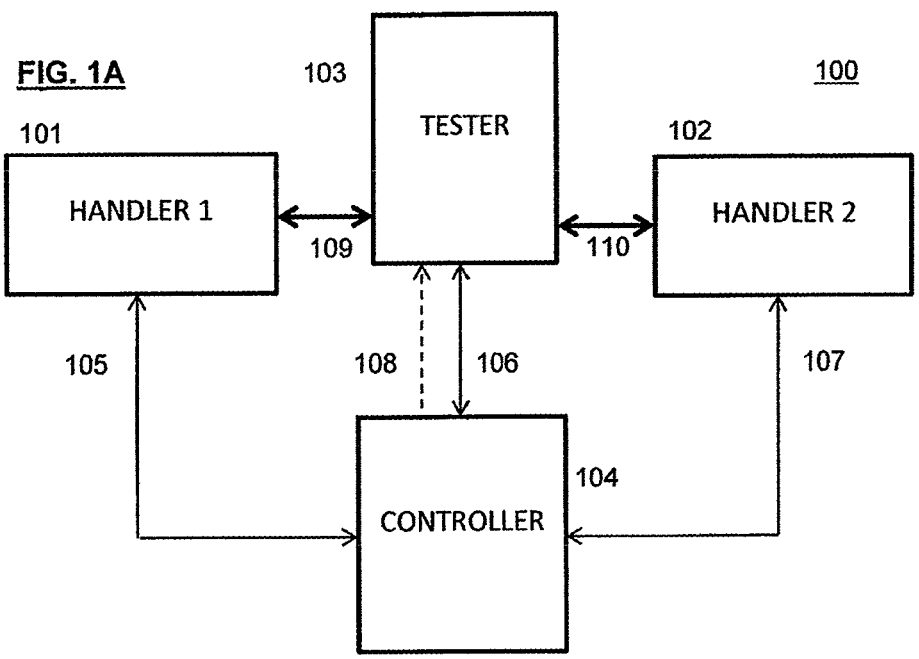
FIG. 1A illustrates a test cell utilizing a multiplexed test cell controller and two parallel redundant handlers.

In view of the foregoing, the present disclosure, through one or more of its various aspects, embodiments and/or specific features or sub-components, is thus intended to bring out one or more of the advantages as specifically noted below. The present disclosure provides a description of a control system and related methodology that utilizes a stand-alone controller for a multiplexed handler test cell in automated and robotic semiconductor test equipment that performs a novel process for performing semiconductor tests.

As used herein, parallel redundancy of handlers means that if one of a plurality of handlers fails, the test cell can continue to operate using the remaining handlers of the plurality of handlers. For instance, in an embodiment of a test cell having two handlers, when one handler experiences an operational failure, the test cell can continue to perform its prescribed testing using the remaining operational handler. This parallel redundancy configuration permits the test cell to remain operational, although at a reduced capacity, thus avoiding operational shutdown. This reduction of index time results in an overall increase in throughput for the test cell, in comparison to conventional test cell configurations having only a single handler.

The test program benefits from the reduction of index time, since the margin for test time reduction before the maximum units per hour (UPH) of the handler is increased. Consequently, test time reduction efforts will continue to yield benefits below the previous UPH limit in test time. Operational efficiency is improved, since the operator workload increases when assigned to the multiplexed test cell having a plurality of handlers. Maintenance efficiency increase since the test cell continues to operate while repairing or performing maintenance on the downed handler. There is also a benefit to capital costs, since the multiplexed test cell using plural handlers can be implemented without capital investment. Additionally, fewer testers are needed to perform the testing. For instance, in configuring a test cell having two parallel redundant handlers, only one tester is required as compared to the conventional configuration wherein one tester is required for each handler. Furthermore, UPH/Area is improved, since the output from the test cell increases without a corresponding increase in the test cell floor space.

A novel system configuration of a test cell utilizing a multiplexed test cell controller and two parallel redundant handlers would include several components including general purpose computer, which when properly programmed with specific testing software, becomes a special purpose computer that is configured for a specialized set of testing operations and functions. This computer would have at least three (3) communications interface ports installed for switching the system control data and at least one communications input/output port to switch the multiplexing relays. A special purpose computer having this configuration would be used as the multiplexed test cell controller, hereafter referred to the "controller" in this disclosure. The test cell also includes two robotic handlers, each with a communications interface for communication with the controller. Only a single compliance tester is required that tests the devices handled and staged for test by the robotics associated with the handlers. The tester further includes a communications interface for communicating with the controller.

The controller is inserted between the two handlers and the tester. The handlers may be either soft docked using three interface boards or hard docked using a single interface board. However, soft docking is much easier to implement that hard docking.

The controller performs many functions, some of which are discussed below. The controller controls the operation of the handlers, and coordinates the handler activity with the tester. The controller also passes start-of-test signals from the handlers to the tester, and passes end-of-test signals from the tester to the handlers. The controller further passes binning information from the handlers to the tester. The controller controls the switching of the multiplexing relays, and provides a power supply for the multiplexing relays for the diagnostic tester. The controller serves as a multiplexing relay diagnostic tester for the multiplexing DIB (Device Under Test Interface Board). The controller also maintains and processes test cell performance data, and provides a user interface for the control system and the diagnostic tester. The controller further communicates with the test floor computer network and text and/or email system. The controller controls the interface of the tester to the two handlers, such that the two handlers appear as a single handler from the perspective of the tester. The controller also gives the tester a simple test, in order to detect which handler is in use. The above functions are representative of the functions performed by the controller, however, the controller is configured to form many other functions as well.

FIG. 1A illustrates a test cell 100 utilizing a multiplexed test cell controller and two parallel redundant handlers 101 and 102, as discussed above. FIG. 1A also discloses a controller 104, and the communication cables 105, 106, and 107 that communicate control signals between the controller 104 and the handler 101, tester 103, and handler 102, respectively. Also illustrated in FIG. 1A are test lines 109 and 110 that communicate the actual electric test signals between the tester 103 and two individual DUT interface boards (not shown) that are mounted to handler 1 (109) and handler 2 (102), respectively. FIG. 1A further includes relay control signals 108 that operate the relays.

Figure 1B:
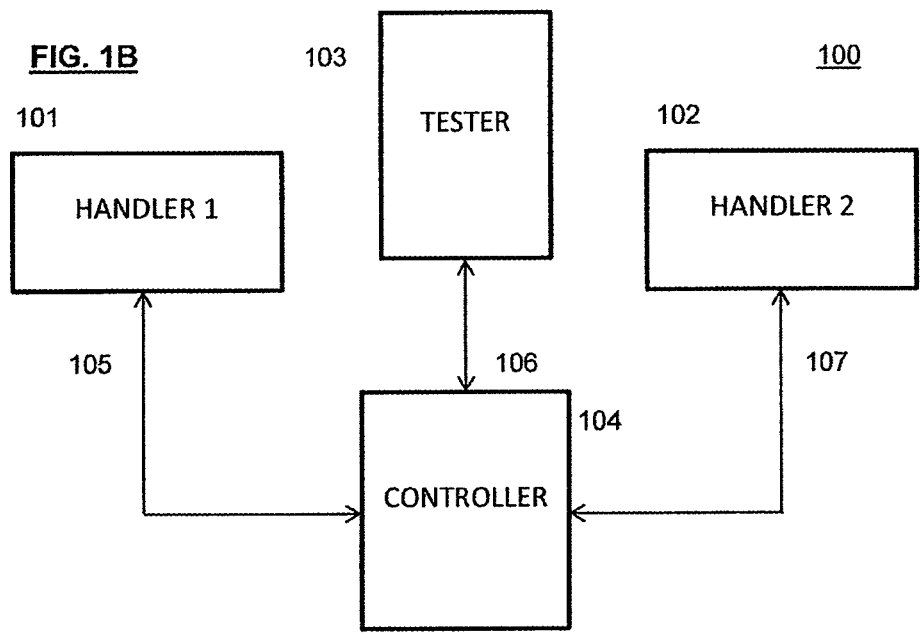
FIG. 1B illustrates the test cell illustrated in FIG. 1A, illustrating the communication interface control lines without the test lines and the relay control signals.

Since the test cell utilizes two conventional handlers 101 and 102 multiplexed to a conventional tester, further discussion regarding the test lines 109 and 110 that communicate the actual electric test signals between the tester 103 and handler 1 (109) and handler 2 (102), and the relay control signals 108, is unnecessary. Thus, the following system description will focus upon relevant control signals by which controller 104 controls handler 1 (101), handler 2 (102), and the tester 103. Thus, for clarity in explaining the novel features of the test cell 100, these test lines 109 and 110, and the relay control signals 108, have been omitted in corresponding FIG. 1B. FIG. 1B illustrates the test cell 100 disposed between the tester 103 and the two handlers 101 and 102.

Figure 2:
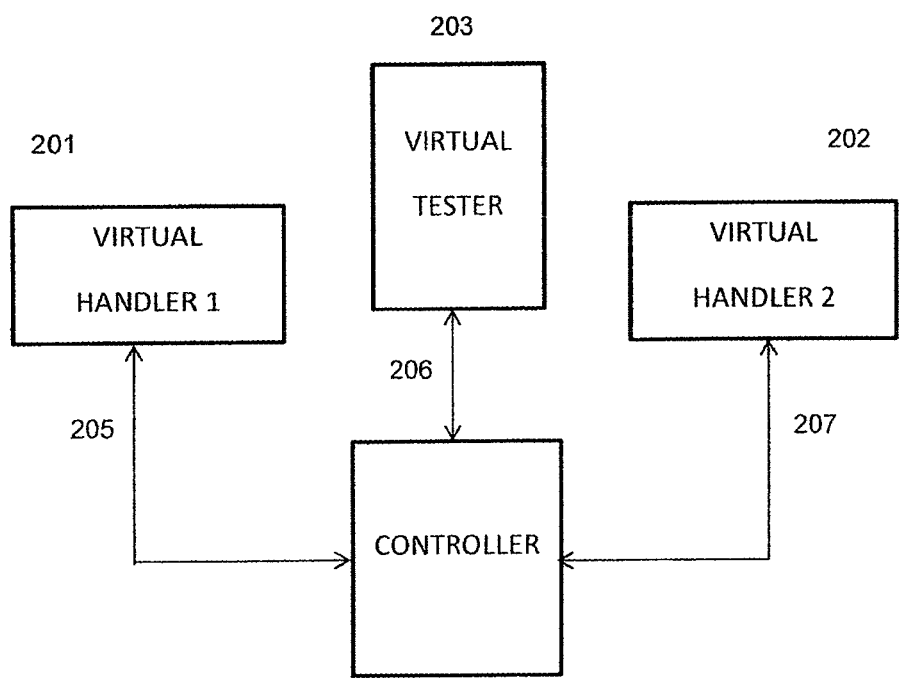
FIG. 2 shows an illustration of a virtual test cell.

In the preferred configuration of the test cell illustrated in FIGS. 1A and 1B, the primary interface between the controller 104 and the tester 103 and the handlers 101 and 102 is system control data. As a result, there is no need to develop and debug the controller using the actual physical tester and handler equipment, which is expensive and time-consuming. Instead, it is possible to utilize a virtual tester and virtual handlers, together with the actual physical controller to create a virtual test cell, which emulates the physical test cell. This emulation may be performed by one of several conventional simulation/emulation software programs, which are programmed and executed on computers to emulate specific physical equipment. One example would be LabVIEW™. Such a virtual test cell is illustrated in FIG. 2. In this figure, the actual physical controller 104, which is the same controller illustrated in FIGS. 1A and 1B, is connected to a virtual handler 1 (201), a virtual tester (203), and a virtual handler 2 (202), via communication cables 205, 206, and 207, respectively.

The advantages of developing and debugging the controller 104 using virtual testers 201 and 202 are many. These advantages include the fact that most of the development and debugging of the controller attached to the virtual test cell 200 can be performed in the laboratory. Only the final stages of implementation are performed with the controller 104 connected to the actual physical test cell 100. Thus, the cost of development is significantly less due to the high costs associated with purchasing or renting a physical tester and physical handlers. As a result, the development time for developing and implementing a physical test cell is significantly shorter. Additionally, this methodology avoids the scheduling problems associated with the availability of a tester and handlers on a test floor. Development can occur in parallel with the design and development of the device under test (DUT) interface and multiplexing boards, if necessary. As a further matter, this methodology is also exceptionally versatile, in that the virtual test cell can be programmed to emulate or mimic any test time, any index time, and any error conditions to exercise and demonstrate system dynamics. Additionally, no expensive test code development or the tester is necessary. The operational impact of taking a handler offline can be tested in the laboratory, thereby not monopolizing expensive equipment on a test floor. Enhancement and improvements to the control system are made and tested in the laboratory without expensive dedication of actual physical test equipment time. Additionally, since each of the virtual handler program runs asynchronously and autonomously, their respective computer systems are two separate systems running asynchronously. This configuration emulates the dual manipulator control of an indexless handler.

FIG. 3 is a flowchart 300 that illustrates the overall control flow of the testing process. The testing process starts at 301 with loading the test program at 302 in the controller. Thereafter, the tester reads the status of the handlers from the controller 104 at 303, and determines if the process has reached the end-of-lot at 304. If the process has reached the end-of-lot, then the process terminates at 305. However, if the process has not reached the end-of-lot, then the test is started at 306. At this point, the status of the handler in the controller is updated at 303, and the controller 104 determines when the device under test (DUT) is ready for testing at 307. When the DUT is ready for testing the testing of the DUT begins at 308. After completion of the testing of the DUT, binning information is generated at 309 and sent to the controller 104. At this point, the tester send an end-of-test (EOT) signal to the controller 104, and writes information related to the testing of the DUT in a data log at 311. Finally, the process goes back to the tester reading the status of the handler from the controller at 303, wherein the process described above resumes.

When the tester reads the handler status from the controller, there are four (4) operational modes supported wherein the testing software is located in the controller. Each of the four operational modes is dependent on the actual test program being executed and the configuration of the actual tester being used. A Table is provided below that summarizes certain features of each of the four operational modes. The Table is followed by a more detailed description of each mode.

TABLE

| MODE | Software Location | Test Program | Tester | STDF Data Log |
|---|---|---|---|---|
| 1 | Controller | No change | Any | No association between handler and STDF data, will have non-STDF data log with handler specific bin data |
| 2 | Controller | One simple register read function, recompile | Any | Handler ID and STDF site data associated via the new register read test |
| 3 | Controller | Parallelism, pin map, recompile | Parallel test, multiple devices mapped to same tester resources | Handler ID and STDF site data associated via the combined multiplexed site STDF data |
| 4 | Controller | Parallelism, pin map, recompile | Parallel test, multiple devices mapped to same tester resources | Complete STDF data, including multiplexed handler ID per test and per site |

An alternative operational configuration to the four operational modes of the test cell would be a configuration essentially identical to Operational Mode 4, with the significant difference being that the testing software is located on the tester workstation. This configuration would be used when a manufacturer does not want to have the controller installed on the test floor. This mode implements the methods of other prior and co-pending applications of the same inventor for a multiplexed handler test cell, and uses the test system's workstations as the host for all software. This mode also requires that the handler driver is integrated into the test program. Since this alternative operational mode is outside the scope of the present patent application, further description of this alternative operational mode is not provided herein.

Operational Mode 1 requires no change to the test program. As a consequence the method may be preferred when the changes to the test program are not an option. In this case, the tester runs as is and the controller monitors yield differences between handlers, and takes appropriate corrective action, when necessary. Site-to-site binning information is intercepted on it way from the tester to the handler, complied, and stored on the controller for retrieval, analysis, and archiving at a later time. Additionally, the Standard Test Data Format (STDF) data log, if it is created, does not associate the handler with the data. This method can be useful for legacy devices and for devices that have very small margins, or when data logging is of no interest.

FIG. 4 illustrates Operational Mode 1 of the test cell via a flowchart 400. In Operational Mode 1, the process begins at 401. At 402, the controller is initialized by the controller software that is located in the controller. During this initialization process, the controller confirms communication with the handlers and the testers. At 403, the process determines if it is the end of lot. When it is determined that the process is not at end of lot, the testing process is executed and contains many operations 404. The controller polls each of the two handlers, starting with the inactive handler, and gets a next start of test. The controller sets both the active handler and the inactive handler. The controller sets the switch relays to connect to the active handler. At this point, the controller sends a start of test signal to the tester. During this process, the controller acknowledges site ready requests from the tester, reads sites ready from the active handler, and sends sites ready signals to the tester.

While testing is being conducted, the tester passes through all communication to the controller. During this process, the controller waits for bin data from the tester, reads bin data from the tester, and sends bin data to the handlers. The controller also waits for an end of test signal from the tester, and reads the end of test signal from the tester upon receipt. At this point in the process, the controller send an end of test signal to the active handler, writes a local data file with the corresponding bin data and handler address. Upon completion of the test, the controller compiles bin results and updates the overall summary data for a plurality of completed tests. Follow-on activities include checking the summary statistics and taking corrective action, if necessary. When an end of lot is determined at 403, the controller send an end of lot signal to the tester at 405, which stops the test 406.

Operational Mode 2 may be used when the test system does not allow for mapping multiple devices to the same set of resources. This mode may also be used for any implementation where it is desirable to minimize changes to the test program and data logging. Similar to Operational Mode the testing software is located in the controller. The test program is modified, however, by a test added to read a status register on the multiplexing tester board.

The status register contains a binary coded status of the active handler. For a two handler multiplexed test cell, this register is a single bit. A zero corresponds to one of the handlers and a one corresponds to the other of the handlers. For alternative configurations that include a plurality of handlers, e.g., three or four handlers, a two bit register would be required.

In the Operational mode 2 configuration, there is no need to increase the parallelism and modify the pin map for the second set of test sites. Any free resource of the tester is used to read the digital signal from the multiplexing DIB and record which handler is active. The test result is not used to judge the device(s) under test as good or bad. It is an information only test and is benign in its liability to the yield and test results.

When using this operational mode, all test data is sorted into the two or more groups selected by the status register. Test sites that have the same number use the same set of tester resources. When this operational mode is selected, the controller does not translate the site information from the two handlers. Almost everything is normal and standard in the test program. The only modification made is the added test that reads the status register. This operational mode is useful when the test program can be easily modified and recompiled, and when it is simple to sort the Standard Test Data Format (STDF) data into two groups representing the two handlers.

FIG. 5 illustrates Operational Mode 2 of the test cell via a flowchart 500. In Operational Mode 2, the process begins at 501. At 502, the controller is initialized by the controller software that is located in the controller. During this initialization process, the controller confirms communication with the handlers and the testers. At 503, the process determines if it is the end of lot. When it is determined that the process is not at end of lot, the testing process is executed and contains many operations 504. The operations listed at 504 are similar to the operations listed for Operational Mode 1 at 404 in FIG. 4, with one notable difference. This difference is that during the testing process, the controller executes the register read test discussed above to identify the active handler. When an end of lot is determined at 503, the controller sends an end of lot signal to the tester at 505, which stops the test 506.

Operational Mode 3 may be used when the test system supports parallel tests and allows multiple devices to be mapped to the same set of tester resources. In this operational mode, the test program is modified to increase the parallelism to reflect the total number of combined sites across two or more handlers. Additionally, the pin map is modified to include the additional sites. This operational mode requires that multiple test sites can be mapped to the same tester resources. This may or may not be allowed and should be checked prior to using this operational mode. If it is not allowed, then the previous Operational Mode 2 should be used. Operational Mode 3 provides the STDF data sorted by the test site. Additionally, in order to the test to read which handler is active and to pass that information along with the STDF data to the data logger, the test program must have one test added.

FIG. 6 illustrates Operational Mode 3 of the test cell via a flowchart 600. In Operational Mode 3, the process begins at 601. At 602, the controller is initialized by the controller software that is located in the controller. During this initialization process, the controller confirms communication with the handlers and the testers. At 603, the process determines if it is the end of lot. When it is determined that the process is not at end of lot, the testing process is executed and contains many operations 604. The operations listed at 604 are similar to the operations listed for Operational Mode 1 at 404 in FIG. 4, with a few notable differences. These differences include the compilation of sites ready form the multiplexed handlers into a single data set. This process includes translating the handler from a plurality of sites, e.g., two sites, masking inactive handler(s), and combining the sites data. When an end of lot is determined at 603, the controller sends an end of lot signal to the tester at 605, which stops the test 606.

Operational Mode 4 should be used when the most comprehensive data logging performance is demanded, and the handler drivers and data post processing software are not permitted to reside on the tester. This operational mode rewrites the STDF data log to satisfy any specific requirements for tracking, the handler and site information. This operational mode may or may not require modifications to the test program similar in scope to the modifications previously described, which could include changes to the parallelism and pin map. This operational mode includes a multithreaded handler driver executing on the controller, instead of the tester's workstation.

Figure 8A:
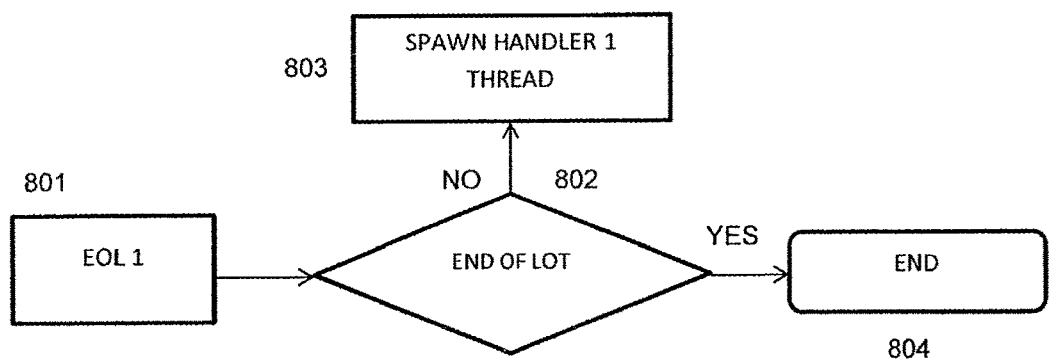
FIG. 8A, and FIG. 8B illustrate operational mode 4 of the test cell.
Figure 8B:
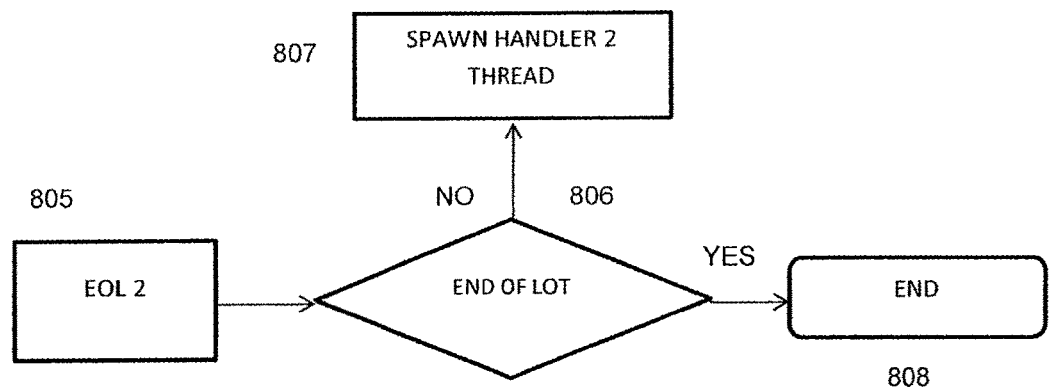

FIG. 7. FIG. 8A, and FIG. 8B illustrate Operational Mode 4 of the test cell via a flowchart 700. Operational Mode 4 starts at 701. At 702, if a first pass is true, the handler addresses are installed on the controller. Default handler addressed may be used under certain circumstances. At 703, the handler 1 thread is spawned. At 704, binning is executed, except during a first pass when it is skipped. At this point the controller polls the sites of handler 1 to determine if they are ready. If a first pass is determined to be false, the handler 1 thread is terminated. Additionally, when experiencing a timeout, the handler 1 thread is terminated and the process proceeds to EOL1 (801), which is illustrated in FIG. 8A. Under these conditions, the controller determines if it is an end of lot at 802. When the controller determines that it is an end of lot, then the controller terminates the process at 804. However, when the controller determines that it is not an end of lot, then the handler 1 thread is once again spawned at 803, and the process resumes at 703.

At 707, the controller waits for the handler 1 thread to execute. At 708, handler 1 sites ready are mapped to active sites. Additionally, the controller switches the relays to connect to handler 1. Write data is recorded using active sites. The controller executes code on active sites only. The controller also maps the active sites to handler 1 sites that are ready. Additionally, binning for handler 1 is sent for handler 1 sites ready. At the completion of 709, the controller spawns the handler 1 thread at 710 and then proceeds back to the previously discussed processes at 704, and waits for the handler 2 thread at 711.

At 705, except during a first pass when the processes listed in 705 are skipped, the controller maps handler 2 sites ready to active sites. The controller also switches the relays to connect handler 2 to the tester, and writes the data record using active sites. The controller executes the code on active sites only, and maps active sites to handler 2 sites ready. The controller also sends binning for handler 2 sites ready. At the completion of 705, the process proceeds to 706, wherein the handler 2 thread is spawned.

After spawning the handler 2 thread at 706, the controller proceeds to 708 and waits for the handler 1 thread at 707.

At 708, binning is executed, except during a first pass when it is skipped. At this point the controller polls the sites of handler 2 to determine if they are ready. If a first pass is determined to be false, the handler 2 thread is terminated. Additionally, when experiencing a timeout, the handler 2 thread is terminated and the process proceeds to EOL2 (805), which is illustrated in FIG. 8B. Under these conditions, the controller determines if it is an end of lot at 806. When the controller determines that it is an end of lot, then the controller terminates the process at 808. However, when the controller determines that it is not an end of lot, then the handler 2 thread is once again spawned at 807, and the process resumes at 706.

At this point, preferred controller requirements will be described. The user interface provided at the controller includes many features. The user interface provides the configuration file path and file name to the user, as well as the handler and tester communication interface addresses. A number of handler and tester status indicators are also provided, including an online indication, an offline indication, an active indication, a testing indication, and other such indicators relating to the status of execution of the testing process. Additionally, the user interface also provides yield information for each handler, such as the percent failure information, and a stop on yield difference field (% fail). The user interface provides a list of the recent communications interface commands received from any source, and a duty cycle indicator for the tester. The user interface includes a pause activator to pause the process, a stop activator to stop the process, an initialize activator to initialize the process, and a start activator to start the process. The user interface provides a testing active indicator, a test time indicator, and a total devices indicator for each handler. Additionally, the user interface provides a control activator to selectively take each handler of a plurality of handlers offline, and provides an error condition indicator and operation alert indicator. The user interface further includes a selectable manual command send control for each handler of a plurality of handlers, as well as a relay control bit polarity activator that allows handlers to be selectively connected.

With regard to the handler communications interface configuration files, the specific communications interface commands are handler dependent. This means that for each handler, certain key commands must be known to the controller program so that appropriated action can be taken and decision branches can be correctly executed. These commands unique to a specific handler are included in a test file and loaded at initialization. A library of these configuration files may be maintained in certain embodiments.

With regard to the relay control signal using a parallel port, the multiplexing relays are controllable by a single digital signal (high or low). The polarity of this bit may be changed from the control screen of the user interface so that the handlers can be selectively connected. The polarity can then be set to switch the relays to the appropriated handler as required by the physical setup. This is the signal that sets the register value in Operational Mode 1 for the controller and the related software.

With regard to the programming of the controller, the controller operates in a multithreaded manner in Operational Mode 4. One of several programming languages may be used for the controller, such as LabVIEW™. Other programming languages, such as C++™ using Open GL™, may be used as an alternative.

Figure 9:
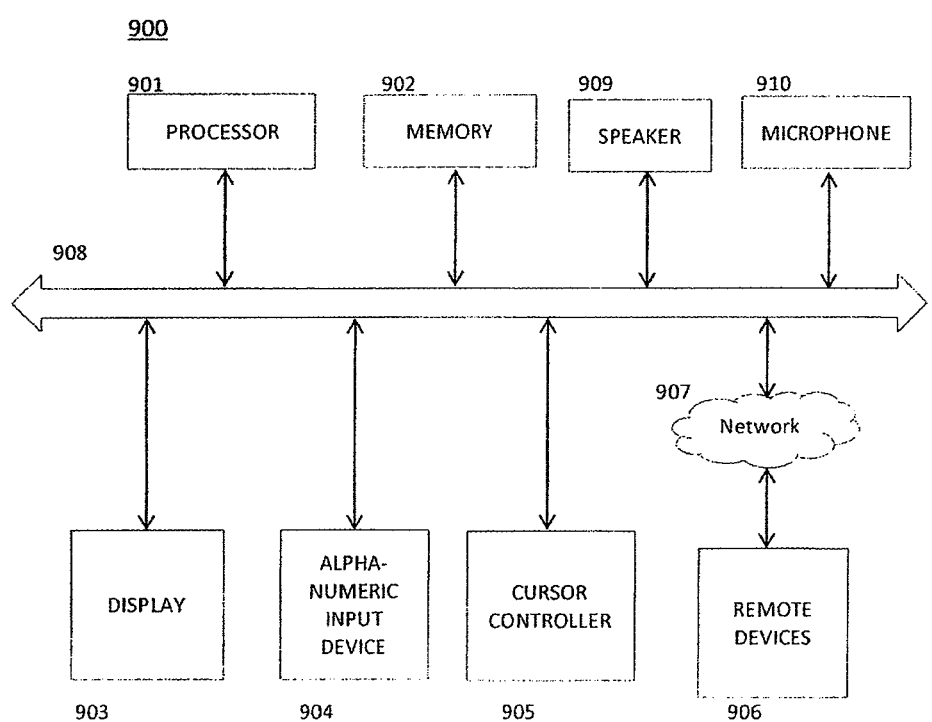
FIG. 9 illustrates an example of a general purpose computer.

The controller includes a computer that may be a general purpose computer, which when properly programmed with specific testing software, becomes a special purpose computer that is configured for a specialized set of testing operations and functions. An example of a general purpose computer is illustrated in FIG. 9. Such a computer frequently includes a graphical user interface.

The controller provides the ability to offline a handler, while the other handler or handlers remain operational. A handler can be off lined, for example, for maintenance or due to an error condition on the handler. If a handler locks up, the controller disengages with the locked handler and continues operating with the other handler or handlers.

With regard to the Virtual Handler and Tester Requirements, the user interface features include a start control, a stop control, a pause control (for example, for testing the timeout loop on the controller), and a load time control (for example, from start to first start of test). Additionally, the controller also includes a control for entering index time, and a control for entering the handler's communications interface address, The controller further includes an indicator for displaying handler status, including, testing, indexing, paused, stopped, etc., and an indicator for duty cycle. For example, a long test time and an idle expensive handler and inexpensive tester running all the time is generally not desired. This problem is transferred from test resource duty utilization in certain embodiments. The controller also includes a yield indicator and a force error control.

The process flow for a virtual handler includes starting the virtual handler. Time passes while the first device is loaded based on a control variable for this elapsed time. When the first device is ready, the handler sends a start of test signal to the tester. The status of the handler is then changed to "testing", "pause" if pause is true and resume when reverted back to false. The status is also updated, as necessary. When the virtual handler thinks it is testing, it may or may not be depending on a status of another handler. The virtual handler also response to any inquiries form the virtual tester. The virtual handler receives binning information and end of test signal from the virtual tester. The virtual handler indexes based on time in a control variable. A next device is ready indication is provided. Additionally, this is an exit loop if "stop" is true, wherein the status is changed to "stopped," and a repeat loop for when the device is ready and the testing resumes.

Each of the virtual handler programs runs asynchronously and autonomously. Their respective computer systems can, for example, be two separate systems running asynchronously. This configuration emulates, or mimics, the dual manipulator control in an indexless handler system. Once a virtual handler issues its start of test, it thinks that the tester is testing its device and does nothing but wait form communication from the tester. This communication may come, for example, in the form of a query or as the end of test and binning command. All other requirements for the virtual handler follow those of the controller.

The Virtual Tester User Interface includes many features, which applies to both handlers in a two handler system, for example. These features include a start control, a pause control that, for example, test the timeout loop on the controller, and a control for entering test time. The user interface also includes a control for entering average yield. The user interface includes an indicator for displaying tester status, such as testing, idle, pause, stop, etc., and an indicator for indicating duty cycle. The user interface further includes a result indicator, which for example includes a pass or fail indication.

Process flow of the Virtual Tester software program includes provisions for starting the virtual tester, waiting for start of test from either handler, having the virtual tester start the testing, and changing the status to "testing." The provisions also include calculating results of the testing based on average yield control, and setting to "pause", if pause is true, resuming when reverted back to false, and updating the status. The provisions further include having the virtual tester sending miscellaneous queries to the virtual handlers and receiving data back from the virtual handlers. Additionally, the virtual tester emulates, or mimics, test time based on one or more control variables. There are also provisions for completing the testing, displaying the test results, and having the virtual tester send binning information to the virtual handler and end of test. The provisions permit changing the status to "idle". Also, this is an exit loop if "stop" is true, which changes the status to "stopped," and a repeat loop to return to the virtual testing, starting testing when testing continues.

FIG. 9 illustrates an exemplary configuration of a general purpose computer 900 on which the process described above may be implemented. The computer 900 includes one or more sets of computer programming instructions that are stored in memory 902 and that can be executed by processor 901 in computer 900 to perform the process described above. The computer 900 may be present in one of many physical configurations, including being configured as a server or as a client terminal. The computer 900 may also be included in various devices, such as a desk-top computer, a laptop computer, a personal digital assistant, a mobile device, an electronic tablet, a smart phone, etc.

As illustrated in FIG. 9, the computer 900 includes a processor 901 and memory 902, which is representative of one or more various memories that may be used by the computer 900. These memories may include one or more random access memories, read only memories, and programmable read only memories, etc. Computer 900 also includes at least one display 903, which may be provided in any form, including a cathode ray tube, a LED display, an LCD display, and a plasma display, etc. The display may include provisions for data entry, such as by including a touch-sensitive screen. Additional output devices may include an audio output device, such as a speaker 909.

Computer 900 further includes one or more input devices. Input devices may include one or more of an alpha-numeric input device 904, such as a keyboard; a cursor controller 905, such as a mouse, touch-pad, or joy-stick; and a microphone 910. Computer 900 also enables processor 901 to communicate with one or more remote devices 906 over a network 907 external to computer 900. Communications internal to computer 900 primarily uses bus 908.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Although the invention has been described with reference to several exemplary embodiments, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed; rather the invention extends to all functionally equivalent structures, methods, and uses such as are within the scope of the appended claims.

While the non-transitory computer-readable medium may be shown to be a single medium, the term "computer-readable medium" includes a single medium or multiple media, such as a centralized or distributed database, and/or associated caches and servers that store one or more sets of instructions. The term "non-transitory computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. Accordingly, the disclosure is considered to include any computer-readable medium or other equivalents and successor media, in which data or instructions may be stored.

Although the present specification describes components and functions that may be implemented in particular embodiments with reference to particular standards and protocols, the disclosure is not limited to such standards and protocols. For example, standards for Internet and other packet switched network transmission represent examples of the state of the art. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A system for utilizing a stand-alone controller in a multiplexed handler test cell, the system comprising:
  a plurality of multiplexed handlers that handle devices subjected to testing;
  a tester that tests the devices subjected to testing that are associated with one of the plurality of multiplexed handlers at a time, in accordance with testing instructions received over a communication link; and
  a stand-alone controller that is operationally located between the tester and the plurality of multiplexed handlers, the stand-alone controller including a storage that stores a set of testing instructions, and a processor that executes the set of testing instructions and that sends the executed testing instructions to the tester over the communication link,
  wherein the system is configured so that the stand-alone controller selectively implements at least one of a plurality of selectable operational modes included in the testing instructions during testing of the devices subjected to testing, the plurality of selectable operational modes including
    (1) a first selectable operational mode that monitors yield differences among the plurality of multiplexed handlers and that executes corrective action, when necessary,
    (2) a second selectable operational mode that modifies the set of testing instructions by adding a test to read a status register on a multiplexing handler board, the status register containing a binary code status of an active handler,
    (3) a third selectable operational mode that supports parallel tests and that maps multiple test sites to same tester resources, and
    (4) a fourth selectable operational mode that includes a multithreaded handler driver executing on the stand-alone controller, which utilizes multithreading in executing the set of testing instructions, and
  wherein the plurality of multiplexed handlers are arranged in a parallel redundancy configuration permitting the multiplexed handler test cell to remain operational during an operational failure of one of the plurality of multiplexed handlers, thus preventing index time associated with the operational failure.

2. The system as described in claim 1, the system further comprising:
  a graphical user interface,
  wherein the storage stores a set of post-testing instructions that are executed by the processor such that the stand-alone controller generates an analysis of results of the testing that are displayed on the graphical user interface.

3. The system as described in claim 1,
  wherein initial setup parameters of the stand-alone controller are generated by utilizing a virtual tester and a plurality of virtual multiplexed handlers.

4. The system as described in claim 1,
  wherein the plurality of multiplexed handlers and the tester each have a General Purpose Interface Bus (GPIB) interface for communicating with the stand-alone controller.

5. A method for utilizing a stand-alone controller in a multiplexed handler test cell, the test cell including a plurality of multiplexed handlers, a tester, and a stand-alone controller, the method comprising:
  configuring the multiplexed handler test cell such that the stand-alone controller is operationally located between the tester and the plurality of multiplexed handlers;
  storing a set of testing instructions in a storage of the stand-alone controller;
  executing the set of testing instructions by a processor of the stand-alone controller;
  selectively transmitting executed testing instructions to the tester; and
  individually testing each of the plurality of multiplexed handlers using the executed testing instructions,
  wherein the method is configured so that the stand-alone controller selectively implements at least one of a plurality of selectable operational modes during testing of the devices subjected to testing, the plurality of selectable operational modes including
    (1) a first selectable operational mode that monitors yield differences among the plurality of multiplexed handlers and that executes corrective action, when necessary,
    (2) a second selectable operational mode that modifies the set of testing instructions by adding a test to read a status register on a multiplexing handler board, the status register containing a binary code status of an active handler,
    (3) a third selectable operational mode that supports parallel tests and that maps multiple test sites to same tester resources, and
    (4) a fourth selectable operational mode that includes a multithreaded handler driver executing on the stand-alone controller, which utilizes multithreading in executing the set of testing instructions, and
  wherein the plurality of multiplexed handlers are arranged in a parallel redundancy configuration permitting the multiplexed handler test cell to remain operational during an operational failure of one of the plurality of multiplexed handlers, thus preventing index time associated with the operational failure.

6. The method described in claim 5, further comprising:
  displaying results of the testing on a graphical user interface of the stand-alone controller.

7. The method described in claim 5, further comprising:
  generating initial setup parameters of the stand-alone controller by utilizing a virtual tester and a plurality of virtual multiplexed handlers.

8. A non-transitory computer-readable storage medium, encoded with a computer-executable program for utilizing a stand-alone controller in a multiplexed handler test cell, the test cell including a plurality of multiplexed handlers, a tester, and a stand-alone controller, the medium comprising:
  a configuring segment that configures the multiplexed handler test cell such that the stand-alone controller is operationally located between the tester and the plurality of multiplexed handlers;

a storing segment that stores a set of testing instructions in a storage of the stand-alone controller;
an execution segment that executes the set of testing instructions by a processor of the stand-alone controller;
a selectively transmitting segment that selectively transmits executed testing instructions to the tester; and
a testing segment that individually tests each of the plurality of multiplexed handlers using the executed testing instructions,
wherein the computer-executable program is configured so that the stand-alone controller selectively implements at least one of a plurality of selectable operational modes during testing of the devices subjected to testing, the plurality of selectable operational modes including
  (1) a first selectable operational mode that monitors yield differences among the plurality of multiplexed handlers and that executes corrective action, when necessary,
  (2) a second selectable operational mode that modifies the set of testing instructions by adding a test to read a status register on a multiplexing handler board, the status register containing a binary code status of an active handler,
  (3) a third selectable operational mode that supports parallel tests and that maps multiple test sites to same tester resources, and
  (4) a fourth selectable operational mode that includes a multithreaded handler driver executing on the stand-alone controller, which utilizes multithreading in executing the set of testing instructions, and
wherein the plurality of multiplexed handlers are arranged in a parallel redundancy configuration permitting the multiplexed handler test cell to remain operational during an operational failure of one of the plurality of multiplexed handlers, thus preventing index time associated with the operational failure.

9. The medium described in claim 8, further comprising:
a generating segment for generating initial setup parameters of the stand-alone controller by utilizing a virtual tester and a plurality of virtual multiplexed handlers.

* * * * *